US010205042B2

United States Patent
Martorell Pena et al.

(10) Patent No.: US 10,205,042 B2
(45) Date of Patent: *Feb. 12, 2019

(54) PHOTOCONVERSION DEVICE WITH ENHANCED PHOTON ABSORPTION

(71) Applicants: FUNDACIÓ INSTITUT DE CIÈNCIES FOTÒNIQUES, Barcelona (ES); UNIVERSITAT POLITÈCNICA DE CATALUNYA, Barcelona (ES)

(72) Inventors: Jordi Martorell Pena, Barcelona (ES); Rafael Andrés Betancur Lopera, Barcelona (ES); Pablo Romero Gómez, Barcelona (ES); Luat Vuong, Barcelona (ES)

(73) Assignees: FUNDACIÓ INSTITUT DE CIÈNCIES FOTÒNIQUES, Barcelona (ES); UNIVERSITAT POLITÈCNICA DE CATALUNYA, Barcelona (ES)

(*) Notice: Subject to any disclaimer, the term of this patent is extended or adjusted under 35 U.S.C. 154(b) by 0 days.

This patent is subject to a terminal disclaimer.

(21) Appl. No.: 15/723,923

(22) Filed: Oct. 3, 2017

(65) Prior Publication Data

US 2018/0047862 A1 Feb. 15, 2018

Related U.S. Application Data

(63) Continuation-in-part of application No. 13/358,687, filed on Jan. 26, 2012, now Pat. No. 9,842,947.

(51) Int. Cl.
*H01L 31/054* (2014.01)
*H01L 31/0216* (2014.01)
(Continued)

(52) U.S. Cl.
CPC .... *H01L 31/0547* (2014.12); *H01L 31/02164* (2013.01); *H01L 31/02168* (2013.01);
(Continued)

(58) Field of Classification Search
CPC ......... H01L 31/022466; H01L 31/0216; H01L 31/02161; H01L 31/02167;
(Continued)

(56) References Cited

U.S. PATENT DOCUMENTS

| 4,126,150 A | 11/1978 | Bell |
| 4,271,328 A | 6/1981 | Hamakawa et al. |

(Continued)

FOREIGN PATENT DOCUMENTS

| WO | 2008112639 A2 | 9/2008 | |
| WO | WO2012018237 | * 2/2012 | .............. H01L 31/00 |

OTHER PUBLICATIONS

Albert D. Liao et al. "Thermally Limited Current Carrying Ability of Graphene Nanoribbons", Physical Review Letters, American Physical Society, Jun. 20, 2011, pp. 256801-1-256801-4, vol. 106, Nol. 25, XP055089212.

(Continued)

*Primary Examiner* — Christina Chern
(74) *Attorney, Agent, or Firm* — Cantor Colburn LLP

(57) ABSTRACT

A photovoltaic device cell comprising a first light transmissive electrical contact, an active region, a second light transmissive electrical contact, and a layered structure enclosing the active region, the layered structure being formed of two parts, a first part underlying the first light transmissive electrical contact and a second part overlying the second electrical contact and wherein the constants of the layers in these layered structures are interdependent such that light is localized within the active region.

6 Claims, 4 Drawing Sheets

(51) Int. Cl.
*H01L 31/048* (2014.01)
*H01L 31/20* (2006.01)
*H01L 31/0352* (2006.01)
*H01L 31/05* (2014.01)

(52) U.S. Cl.
CPC ...... *H01L 31/0352* (2013.01); *H01L 31/0481* (2013.01); *H01L 31/0504* (2013.01); *H01L 31/202* (2013.01); *Y02E 10/52* (2013.01)

(58) Field of Classification Search
CPC ....... H01L 31/02168; H01L 31/022491; H01L 31/0344; H01L 31/048; H01L 31/0481; H01L 31/054; H01L 31/0547
See application file for complete search history.

(56) References Cited

U.S. PATENT DOCUMENTS

| | | | |
|---|---|---|---|
| 4,442,185 A | 4/1984 | Skotheim | |
| 4,442,310 A | 4/1984 | Carlson | |
| 4,609,771 A | 9/1986 | Guha et al. | |
| 4,795,500 A | 1/1989 | Kishi et al. | |
| 5,828,117 A | 10/1998 | Kondo et al. | |
| 6,114,046 A * | 9/2000 | Hanoka | B32B 17/10018 136/251 |
| 2003/0070706 A1* | 4/2003 | Fujioka | H01L 31/048 136/251 |
| 2008/0190479 A1 | 8/2008 | Hsieh et al. | |
| 2008/0216885 A1 | 9/2008 | Frolov et al. | |
| 2009/0025791 A1 | 1/2009 | Matsui et al. | |
| 2009/0032098 A1 | 2/2009 | Lu | |
| 2009/0140801 A1 | 6/2009 | Ozyilmaz et al. | |
| 2009/0194161 A1 | 8/2009 | Ji et al. | |
| 2009/0211633 A1 | 8/2009 | Schilinsky et al. | |
| 2011/0030792 A1 | 2/2011 | Miguez | |
| 2013/0118567 A1* | 5/2013 | Kim | H01L 27/302 136/255 |
| 2013/0192666 A1 | 8/2013 | Martorell Pena et al. | |

OTHER PUBLICATIONS

Frank H. L. Koppens et al. "Graphene Plasmonics: A Platform for Strong Light-Matter Interactions", Nano Letters, ACS Publications Amercian Chemical Society, Jul. 18, 2011, pp. 3370-3377, vol. 11, No. 8, XP055074440.

International Search Report dated Dec. 2, 2013; re: PCT/EP2013/051532; citing: WO 2008/112639 A2, Ryzhii et al. "Device Model for Graphene . . . ", Ju et al. "Graphene Plasmonics . . . ", US 2009/140801 A1, Tian et al. "Ambipolar graphene . . . ", Bae et al.

J. F.Tian et al. "Ambipolar graphene field effect transistors by local metal side gates", Appied Physics Letters, American Institute of Physics, Jul. 1, 2010, pp. 263110-1-236110-3, vol. 96, No. 26, Melville, NY US, XP012131771.

J. Meier, "Potential of amorphous and microcrystalline silicon solar cells", Thin Solid Films 451-452 (2004) 518-524.

Justin C.W. Song et al. "Hot Carrier Transport and Photocurrent Response in Graphene", Nano Letters, ACS Publications, American Chemical Society, Sep. 21, 2011, pp. 688-4692, vol. 11, No. 11, XP055089626.

Long Ju et al. "Graphene plasmonics for tunable terahertz metamaterials", Nature Nanotechnology, Sep. 4, 2011, pp. 630-634, vol. 6, No. 10, XP055019212.

Myung-Ho Bae et al. "Scaling of High-Field Transport and Localized Heating in Graphene Transistors" ACS NANO, American Chemical Society, Sep. 13, 2011, pp. 7936-7944, vol. 5, No. 10, XP055089197 www.acsnano.org.

Nathaniel M. Gabor et al. "HotCarrier-Assisted Intrinsic Photoresponse in Graphene", Science, Oct. 6, 2011, pp. 648-652, vol. 334, No. 6056, www.sciencemag.or XP055089620.

Richard Lunt, "Transparent, near-infrared organic photovoltaic solar cells for window and energy-scavenging applications" Applied Physics Letters 98, 113305 (2011).

Ruud E. I. Schropp, "Amorphous and Microcrystalline Silicon Solar Cells", Modeling, Materials and Device Technology, Book, p. 160-162.

Stephane Berciaud et al. "Electron and Optical Phonon Temperatures in Electrically Biased Graphene", Physical Review Letters, The American Physical Society, Jun. 3, 2010, pp. 227401-1-227401-4, vol. 104, No. 22, XP055089204.

Sukosin Thongrattanasiri et al. "Complete Optical Absorption in Periodically Patterned Graphene", Physical Review Letters, American Physical Society, Jan. 27, 2012, pp. 047401-1-047401-5, vol. 108, No. 4, XP055088171.

Victor Ryzhill et al. "Device Model for Graphene Nanoribbon Phototransistor", Applied Physics Express, The Japan Society of Applied Physics, Jun. 6, 2008, 063002-1-063002-2, vol. 1, No. 6, XP001516309.

* cited by examiner

US 10,205,042 B2

PHOTOCONVERSION DEVICE WITH ENHANCED PHOTON ABSORPTION

CROSS-REFERENCE TO RELATED APPLICATIONS

This application is a Continuation-In-Part of U.S. application Ser. No. 13/358,687, filed on Jan. 26, 2012, the disclosure of which is incorporated herein by reference in its entirety.

TECHNICAL FIELD

The present application relates to photoconversion devices such as photovoltaic cells or photodetectors. More in particular, the application is related to a light transmissive layered structure to achieve light localization in the active region of a photovoltaic device.

BACKGROUND

Light localization has been used effectively to enhance the performance of many devices that rely on an efficient interaction between light and matter. Light localization refers to an increase of the light intensity in a local region on the axis or longitudinal direction of the light propagation. Light localization can be achieved using Fabry-Perot type cavities, periodic gratings, photonic crystals, micro-resonators, periodic or non-periodic distribution of layers that alternate high and low index of refraction materials, and many other distributions of dielectric or metallic materials. In photovoltaic devices, photons (light) absorbed by the photovoltaic active material are converted to electron-hole pairs or charged carriers. An effective absorption of the light by such photovoltaic material can be achieved when the thickness of such layer is longer than the material photon absorption length in a broad range of the solar spectrum. This length varies from one photovoltaic material to another but, an effective absorption of photons in a broad range of the solar spectrum may require the use of 10s or 100s of microns of active material. Several drawbacks are linked to the use of such thick material layers as, an increase in material cost, an increase in electron-hole recombination due to the finite carrier drift or diffusion length, or a reduction in transparency for cells meant to be used as windows, for instance, in Building integrated photovoltaics (BIPV). Several techniques to increase light absorption in thin-film devices and methods of manufacturing the same have been disclosed in patents and journal publications.

U.S. Pat. No. 4,126,150 sets forth a transparent layer which thickness is adjusted to increase the solar radiation absorption efficiency.

J. Meier et al. Thin Solid Films 451-452 (2004) 518-524 report on the use of an anti-reflection multilayer design in order to couple more light inside an amorphous silicon p-i-n cell.

U.S. Pat. No. 4,442,310 discloses a spacer layer in between the back metal contact and the body of the active material to reduce the reflectivity of the photovoltaic cell in a particular wavelength range. A similar approached applied to dye sensitized solar cells and using a one-dimensional photonic crystal to achieve reflection was disclosed in US 2011/0030792 A1.

R. R. Lunt et al. Applied Physics Letters 98 (2011) Art. No. 113305 report on the use of distributed Bragg reflector mirror to increase reflectivity in the infrared which subsequently increases the efficiency of a low efficiency transparent organic solar cell.

In amorphous silicon cells, typically, an increase in the absorption light trapping is achieved by introducing a textured substrate and special back reflectors. This leads to a large suppression of losses due to optical reflection outside the cell or to light transmission to the back contact as described by Ruud E. I. Schropp and M. Zeman in "Amorphous and Microcrystalline Silicon Solar Cells," published by Kluwer Academic Publishers (1998) p. 160-162. However, textured substrates or textured layers are a source of diffusion which in a transparent cell to be used for instance, in automobile windshields or in architectural installations would lead to a loss of clear vision.

SUMMARY OF THE INVENTION

The main object of the present invention is to increase absorption in a photodetector or photovoltaic cell. This effect is achieved by using an optical layered structure to achieve light localization in the photovoltaic active region of the device. Light localization as opposed to conventional light trapping offers the possibility to increase absorption without light diffusion or scattering. The photodetector or photovoltaic cell comprises a first light transmissive electrical contact underlying one surface of the active photosensitive region, a photosensitive region, a light transmissive electrical contact overlying the opposite surface of the photosensitive region, and a light transmissive layered structure separated in two layered parts, one part underlying the first electrical contact and a second part overlying the second electrical contact.

BRIEF DESCRIPTION OF THE DRAWINGS

To complete the description and in order to provide for a better understanding of the invention, a set of drawings is provided.

DETAILED DESCRIPTION OF THE INVENTION

Figure 1:
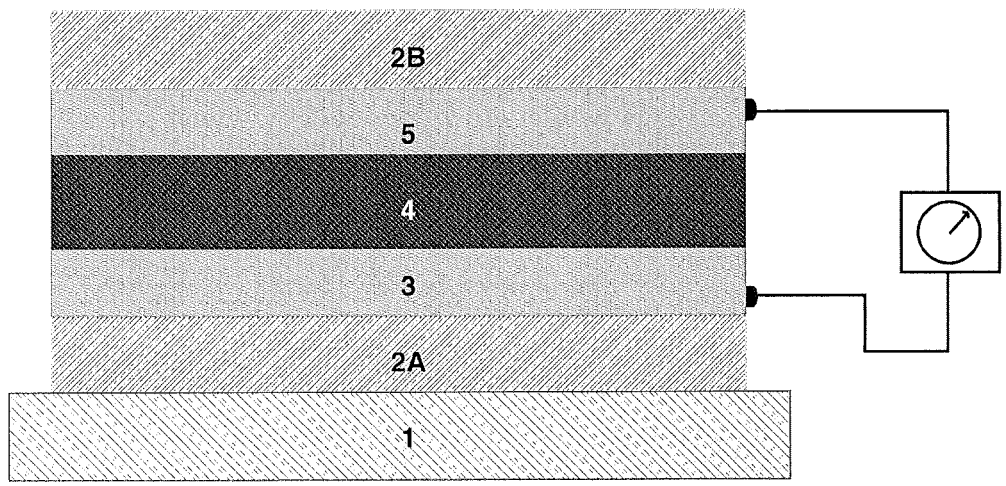
FIG. 1 is the cross-sectional representation of the photovoltaic device of the present invention.

The present invention integrates a photodetector or photovoltaic cell in a structure of light transmissive parts 2 that can be comprised of sub-layers, where the index of refraction of a given sub-layer is different than the index of refraction of the adjacent layer. It is understood that sub-layers become indistinguishable when the index of refraction is the same at all wavelengths. The thickness of each part (2A, 2B) is determined to effectively localize light (photons) in the active region of the device depending on the number of sub-layers. Such a design allows to achieve light localization in a broad wavelength range within the absorption band of the active region 4. By active region 4 is meant the portion of the device in which light (or photons) can be absorbed to generate carriers. The light transmissive layered structure comprises at least two parts, one part 2A underlying and in contact the first light transmissive electrode 3, which is underlying the active region 4, and a second part 2B overlying and in contact with the second transmissive electrode 5 which is overlying the active region 4. However, the layered structure acts as a single element with one purpose, i.e. localizing light. To localize light effectively the constants of both parts must be interdependent.

In one embodiment, the invention comprises a photodetector or photovoltaic device comprising a light transmissive substrate 1, a first part 2A of the light transmissive layered structure 2 overlying the substrate 1, a light transmissive first electrical contact 3 overlying the first part of the layered structure 2A, an active region 4 overlying the first part of the layered structure, a second light transmissive electrical contact 5 overlying the active region 4, and the second part 2B of the light transmissive layered structure 2 overlying the second light transmissive electrical contact 5.

The photovoltaic active region 4 is described as an amorphous silicon PIN junction solar cell. The thickness of the active region 4 ranges from 20 to 100 nanometers. It is evident to those skilled in the art that the photovoltaic active region could be of other similar material configurations, e.g. microcrystalline silicon or amorphous silicon and germanium. It is also evident to those skill in the art that the photovoltaic active region 4 could be of other material configurations such as a two-junction semiconductor cell, a triple-junction semiconductor cell, or a tandem semiconductor with a three terminal structure cell. The latter structures may contain additional light transmissive electrical contacts interlayered in the active region.

The photovoltaic active region 4 can also be described as an organic, or partially organic type semiconductor junction including: a transparent n-type semiconductor acting as an electron transporting or an electron pass filter layer underneath an absorber layer composed of a blend of two or more organic semi-conductor materials being at least one of them an electron donor and at least one of the an electron acceptor, underneath a transparent p-type semi-conductor acting as a hole transporting or a hole pass filter layer. The order of the n-type and p-type filters may be interchanged.

For the partially organic type semiconductor junction in 4, the n-type material layer may comprise a transparent, either homogenous or with a nanoparticle, or both, morphology layer (thickness between 1 nm and 100 nm) of either ZnO, or In doped ZnO, or Al doped ZnO, or Ga doped ZnO, or Mn doped ZnO, or $TiO_2$, or $SnO_2$, or Poly [(9,9-bis(3'-(N,N-dimethylamino)propyl)-2,7-fluorene)-alt-2,7-(9,9-dioctyl-fluorene)] PFN), or derivatives of PFN, Polyethylenimine (PEI) and derivatives, or a combination of them, the absorber layer may be a layer (thickness between 18 nm and 200 nm) comprising the blend of two organic materials, being one of them an electron donor conjugated polymer with alternating electron-donor and electron-acceptor monomers where the donor is a derivative of benzo[1,2-b:4,5-b'] dithiophene, whereas as for the acceptor many different types of compounds can be used, for example, though not exclusively, thiophene, benzothiadiazole or diketopyrrolo-pyrrole derivatives, such as for instance, the electron donor conjugated polymer poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene-)-2-carboxylate-2-6-diyl)] (PTB7-Th), and being the other organic material in the blend an electron acceptor as $C_{60}$, or a soluble derivative of the fullerene family of compounds, or a non-fullerene electron acceptor, such as for instance, IHIC which is based on an electron-rich fused hexacyclic unit end-capped with an electron-deficient unit; 1,1-dicyano-methylene-3-indanone (IC), or ATT-1 containing an effective thieno[3,4-b]thiophene and 2-(1,1-dicyanomethylene)rhodanine combination, and the p-type material may comprise a transparent either homogenous or with a nanoparticle morphology layer (thickness between 1 nm and 100 nm) of either $MoO_3$, or PEDOT:PSS, PCPDTPhSO3Na (CPE-K), or $WO_3$, or NiO, PTAA, Spiro-TAD or a combination of them. Alternatively, the absorber layer in the partially organic type semiconductor junction for the active region 4 may comprise a blend layer (thickness between 18 nm and 200 nm) of two organic materials, being one of them a α-PTPTBT polymer, where the electron donating unit is a thiophene-phenylene-thiophene (TPT) and the acceptor unit is 2,1,3-benzothiadiazole (BT), and being the other one $C_{60}$ or a soluble derivative of the fullerene family of compounds, or a nonfullerene electron acceptor.

Alternatively, the absorber layer in the partially organic type semiconductor junction for the active region 4 may comprise a blend layer (thickness between 18 nm and 200 nm) of two organic materials, being the electron donor the polymer poly[(2,6-(4,8-bis(5-(2-ethylhexyl)thiophen-2-yl)benzo[1,2-b:4,5-b']-dithiophene))-alt-(5,5-(1',3'-di-2-thienyl-5',7'-bis(2-ethylhexyl)benzo[1',2'-c:4',5'-c']dithiophene-4,8-dione))] (PBDB-T), and the electron acceptor the non-fullerene acceptor 3,9-bis(2-methylene-(3-(1,1-dicyanomethylene)indanone))-5,5,11,11-tetrakis(4-hexylphenyl)dithieno[2,3-d:2',3'-d' ]-s-indaceno[1,2-b:5,6-b' ]-dithiophene (ITIC).

Alternatively, the absorber layer in the partially organic type semiconductor junction for the active region 4 can be composed of a blend layer (thickness between 18 nm and 200 nm) of two organic materials, being one of them polythiophene polymer (P3HT) or an oligomer of the thiopene unit, and the other one $C_{60}$ or a soluble derivative of the fullerene family of compounds, or a nonfullerene electron acceptor.

In FIG. 1 the active region 4 comprises an intrinsic type conductivity region of amorphous silicon having a good optical absorption and regions of opposite conductivity type forming a p-i-n type semiconductor. The first part 2A of the layered structure comprises at least one or many sub-layers of light transmissive materials as dielectric materials or thin metals. It is understood that what differentiates a sub-layer from another sub-layer of the layered structure in the present invention is the index of refraction. It is also understood that two sub-layers become indistinguishable when the index of refraction is the same at all wavelengths. The index of the first sub-layer of such first part 2A of the layered structure overlying the substrate material 1 must have an index of refraction different than the index of the second sub-layer overlying the first. The second sub-layer overlying the first must have an index of refraction different than the first sub-layer underlying the second and the third sub-layer overlying the second sub-layer. This sequencing is repeated up to the last sub-layer underlying the first transmissive electrical contact 3. The second part 2B of the layered structure comprises at least one or many sub-layers of light transmissive materials as dielectric materials or thin metals. The index of the first sub-layer of such second layered structure overlying the second electrical contact must have an index of refraction different than the one of the second sub-layer overlying the first. The second sub-layer overlying the first must have an index of refraction different than the first sub-layer underlying such second sub-layer and the third sub-layer overlying such second sub-layer. This sequencing is repeated up to the last sub-layer. The total number of sub-layers, material and thickness of each sub-layer are chosen to maximize the performance of photovoltaic device. The thickness of each sub-layer may range from one atom thick layer to 200 nm. The exact selection of material and thickness for each sub-layer depends on the constants of the of rest of sub-layers and the constants of the other layers of the device 3, 4, and 5. Maximize the performance of the device must be understood as to achieve an optimal light localization that maximizes the efficiency of light to electricity conversion, minimizes the fabrication cost of the device, and optimizes other useful properties of the photovoltaic device as the light transmission in the visible region, filtering in the UV or Infrared, or the color hue of the vision obtained by the human eye through the device. An optimal light localization must be understood as limited to the spectral region of maximum sun light absorption by amorphous silicon, the active material 4. Such spectral region comprises the visible and near infra-red portions of the light spectrum which wavelength ranges from 400 to 800 nanometers.

The substrate 1 of the invention can be of any light transmissive rigid or flexible material on which the photovoltaic cell can be grown upon as glass, crystal, transparent metal, semiconductor, plastic. Examples of these materials are silica (SiO2), borosilicate (BK7) and PET. The first and second transmissive electrical contacts (3 and 5) may comprise a thin metal layer from the elements of the group of Ag, Al, Au, Ti, Ni, Cu, . . . or combinations thereof, or a transparent conductive oxide layer from the group of ITO, ZnO, Al:ZnO, SnO2, FTO, or conductive polymers such as PEDOT, PEDOT:PSS, PEDOT-TMA or a carbon nanotube, or a graphene layer. Each sub-layer of the layered structure 2 may comprise a transparent inorganic material such as TiO2, SiO2, SiN1.3:H, SiO2:F, Ta2O5, ZnO, Al2O3, ZnS, MgF2,CaF2, or mixtures of them. Alternatively the sub-layers may comprise polymer materials such as PMMA, Polystyrene, PET, or mixtures of polymers and inorganic materials, polymers and thin metals, or inorganic materials and thin metals.

Figure 2:
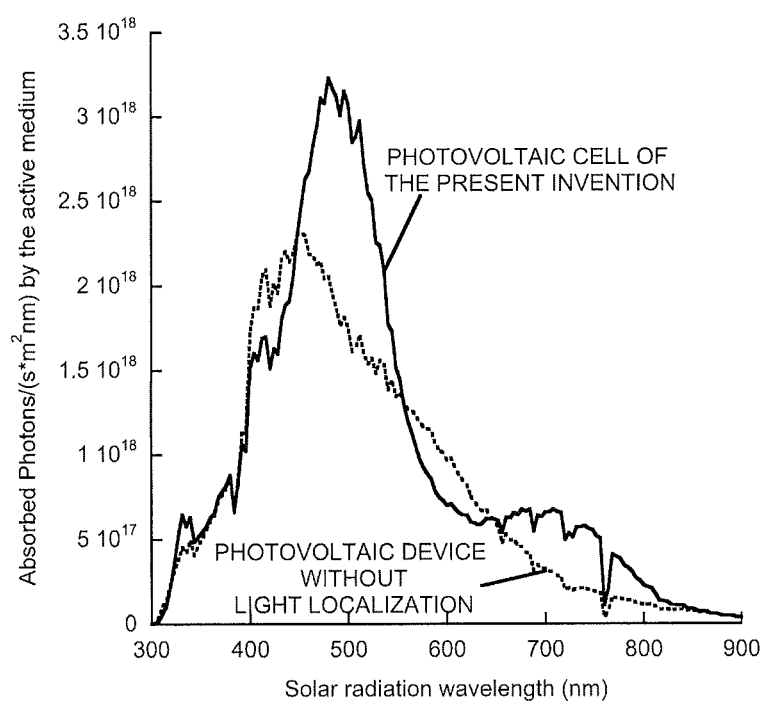
FIG. 2 is a graph comparing the absorbed photons, which is proportional to the photo-carrier generation efficiency, for the photovoltaic cell of the present invention when the active material is amorphous silicon to a cell with no light localization with the same thickness of amorphous silicon as active material.

Referring to FIG. 2 a comparison is shown of the absorbed number of photons which is directly proportional to the photo-carrier generation efficiency of the solar cell of the present invention to the absorbed number of photons of a similar solar cell, which does not include the layered structure 2 for light localization. The solid line in FIG. 2 represents the absorbed number of photons under AM1.5 illumination of 1 sun as a function of the wavelength of the incident light for the cell of the present invention. The dashed line represents the photo-carrier generation efficiency under the same illumination conditions as a function of the wavelength of the incident light for the comparison cell.

Figure 3:
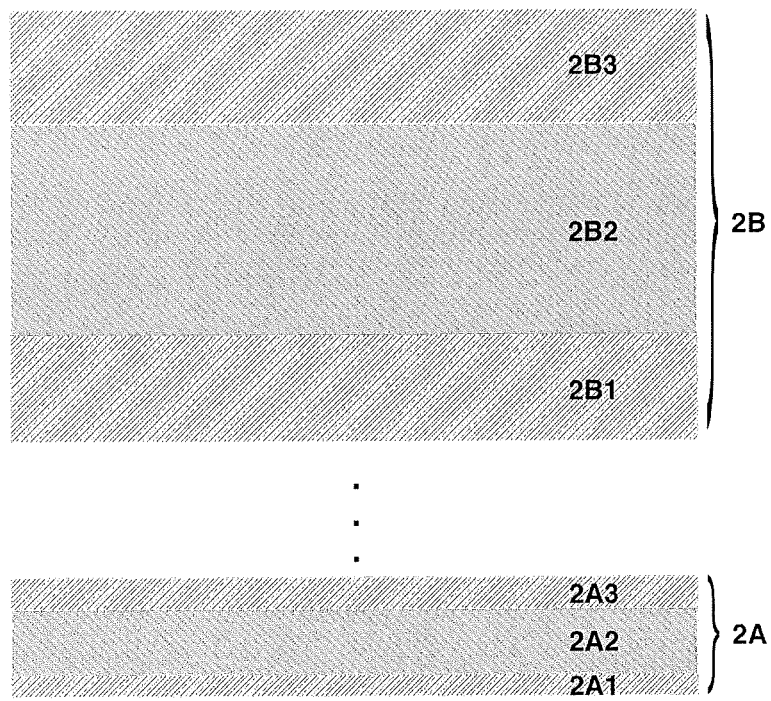
FIG. 3 is the cross-sectional representation of the best mode layered structure for light localization.

The absorbed number of photons of both cells is computed numerically. The body of the cell of the present invention comprises a silica glass substrate. A 260 nm thick AZO electrode underlying an 40 nm p-i-n amorphous silicon diode, a 90 nm ITO electrode overlying the p-i-n diode, and a six sub-layer structure separated into two parts. Referring to FIG. 3, the first part 2A is composed of a 10 nm sub-layer 2A1 of TiO2, overlying the substrate and underlying a 32.5 nm SiO2 sub-layer 2A2, underlying a second 15 nm TiO2 sub-layer 2A3, which is underlying the AZO electrode. The second part 2B is composed of a 50 nm TiO2 sub-layer 2B1 overlying the ITO electrode, a 97.5 nm SiO2 sub-layer 2B2 overlying the first TiO2 sub-layer 2B1 of that second part and underlying the last 50 nm TiO2 sub-layer 2B3 which is the last layer that also isolates the rest of the device from air. The body of the comparison cell is the same except that it does not include the layered structure 2 for light localization.

Figure 4:
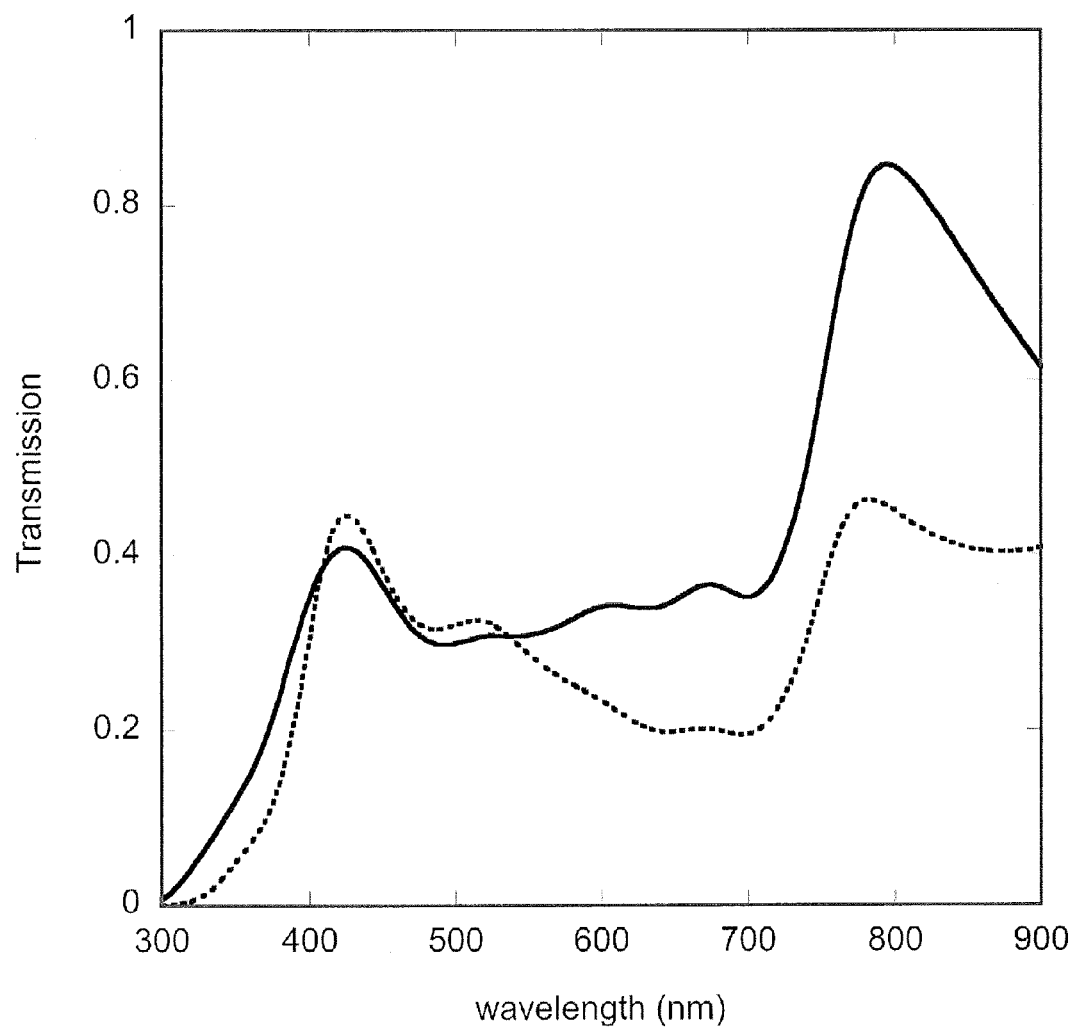
FIG. 4 is a graph comparing the predicted external quantum efficiency and short circuit current density of the present invention with a semi-transparent cell which does not include the light transmissive layered structure of the present invention.
Figure 5:
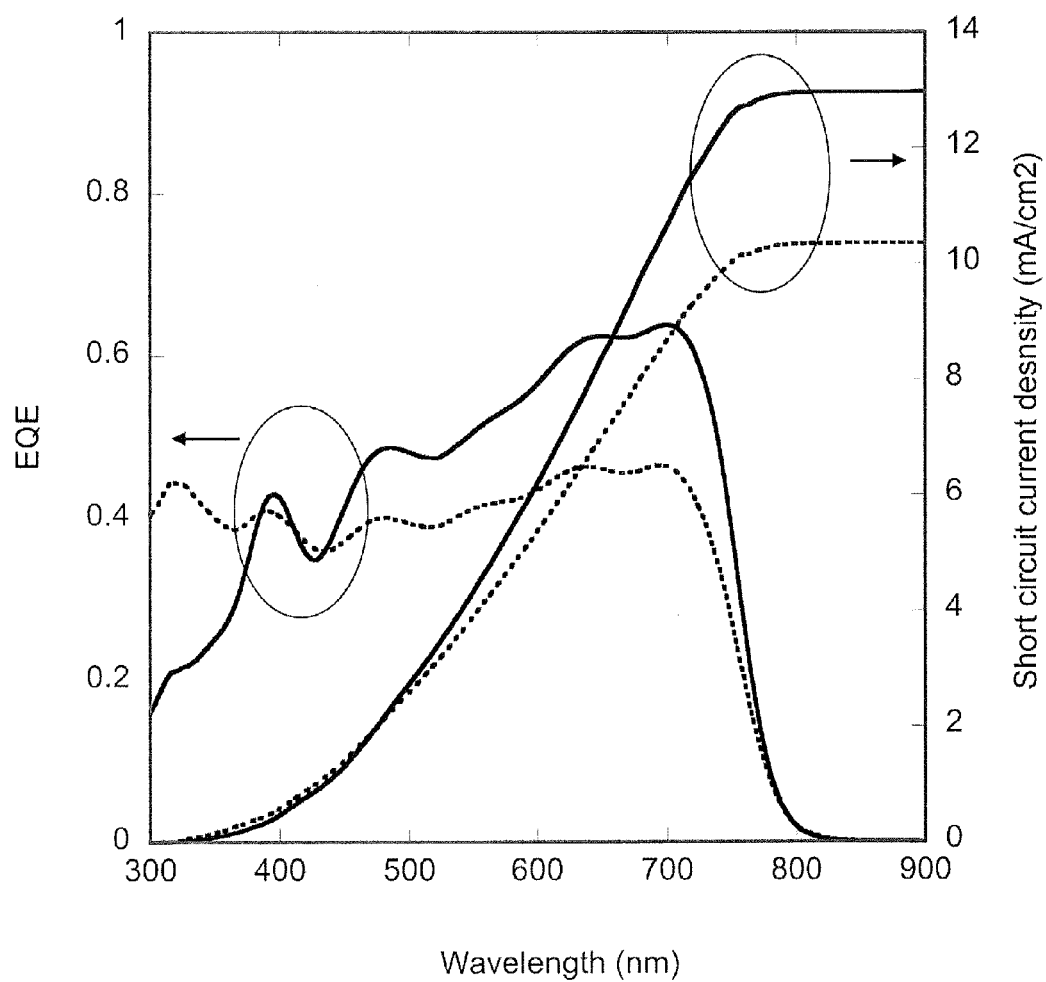
FIG. 5 is a graph comparing the predicted light transmission of the present invention with a semi-transparent cell which does not include the light transmissive layered structure of the present invention.

FIG. 4 is a graph comparing the predicted external quantum efficiency and short circuit current density of the invention (solid line) with a semi-transparent cell which does not include the structure 2 (dashed line), while FIG. 5 is a graph comparing the predicted light transmission of the invention (solid line) with a semi-transparent cell which does not include the structure 2 (dashed line). For these graphs in FIGS. 4 and 5, the embodiment of the invention comprises: a light transmissive substrate made of glass with an index of refraction of approximately 1.54, a first part 2A of the light transmissive layered structure 2 overlying the substrate 1 composed of a 14.5 nm sub-layer of TiO2 and a 5 nm sub-layer of ZnO, a light transmissive first electrical contact 3 composed of a 7 nm Ag layer overlying the first part of the layered structure 2A, an active region overlying the first part of the layered structure, comprising an electron transporting layer comprising a 15 nm layer of n-type ZnO, an 80 nm blend layer comprising the polymer PTB7-Th and the fullerene derivative $PC_{71}BM$ mixed in a 1:2 weight ratio, and a hole transporting layer comprising a 5 nm layer of p-type $MoO_3$, a second light transmissive electrical contact 5 composed of a 10 nm Ag layer overlying the active region 4, and the second part 2B of the light transmissive layered structure 2 overlying the second light transmissive electrical contact 5 composed of a 40 nm layer of $MgF_2$, a 90 nm layer of $MoO_3$, a 130 nm layer of $MgF_2$, and a 110 nm layer of $MoO_3$, and a protective glass with and index of refraction of 1.54 overlaying 2B. For these graphs in FIGS. 4 and 5, the embodiment of the semi-transparent cell which does not include the structure 2 is the same as the embodiment of the invention except that the structure 2 is eliminated and the absorber layer is 95 nm thick instead of 80 nm. Note that the invention allows for a tremendous 25% increase in short circuit current density using an absorber layer which is 15 nm thinner than the absorber layer for the semi-transparent cell which does not include the structure 2. Note also that light transmission in the visible is very similar for both embodiments except for a small reduction in the red for the embodiment of the invention that will give that cell a slightly bluish hue.

In this text, the term "comprises" and its derivations (such as "comprising", etc.) should not be understood in an excluding sense, that is, these terms should not be interpreted as excluding the possibility that what is described and defined may include further elements. On the other hand, the invention is obviously not limited to the specific embodiment(s) described herein, but also encompasses any variations that may be considered by any person skilled in the art (for example, as regards the choice of materials, dimensions, components, configuration, etc.), within the spirit of the invention.

The invention claimed is:
1. A photovoltaic device comprising
    a first light transmissive electrical contact structured to connect the photovoltaic device to an external circuit;

an active region which is made of a partially organic type semiconductor junction comprising a transparent electron transporting layer underneath an absorber layer composed of a mixture of two or more organic semiconductor materials underneath a transparent hole transporting layer or comprising the transparent hole transporting layer underneath the absorber layer composed of the mixture of two or more organic semiconductor materials underneath the transparent electron transporting layer;

a second light transmissive electrical contact structured to connect the photovoltaic device to the external circuit, wherein the first light transmissive electrical contact and the second light transmissive electrical contact are each in direct contact with the active region; and a light transmissive layered structure enclosing the active region, the light transmissive layered structure being formed of a first layered structure part and a second layered structure part, the first layered structure part underlying and directly in contact with the first light transmissive electrical contact, and the second layered structure part overlying and directly in contact with the second light transmissive electrical contact, wherein the first layered structure part and the second layered structure part act as a single element such that light is localized within the active region, wherein the first layered structure part and the second layered structure part each comprises two or more sub-layers of different transparent materials, the transparent materials are independently selected from the group consisting of $TiO_2$, $SiO_2$, $SiN_{1.3}$:H, $SiO_2$:F, $Ta_2O_5$, ZnO, $Al_2O_3$, ZnS, $MgF_2$, PMMA, Polystyrene, PET, mixtures of polymers, inorganic materials, and thin metals, and each sub-layer is a continuous layer covering the entire surface area of the active region;

wherein the index of refraction of a first sub-layer of transparent material of both first layered structure part and the second layered structure part is different from an adjacent sub-layer of transparent material; and wherein the first and the second light transmissive electrical contacts comprise a thin layer of a metal selected from the group consisting of Ag, Al, Au, Ti, Ni, Cu, and combinations thereof.

2. The photovoltaic device as in claim 1 having a light transmissive substrate underlying the first layered structure.

3. The photovoltaic device according to claim 1, wherein the first layered structure part comprises a first sub-layer of $TiO_2$, a second sub-layer of $SiO_2$, and a third sub-layer of $TiO_2$.

4. The photovoltaic device according to claim 1, wherein each sub-layer consists of a single material independently selected from the group consisting of $TiO_2$, $SiO_2$, $SiN_{1.3}$:H, $SiO_2$:F, $Ta_2O_5$, ZnO, $Al_2O_3$, ZnS, and MgF.

5. The photovoltaic device according to claim 1 where the thickness of the active region is between 20 nm and 200 nm.

6. The photovoltaic device according to claim 1 wherein a light transmissive layered structure enclosing the active region contains one or more inorganic material sub-layers consisting of $MoO_3$.

* * * * *